(12) United States Patent
Liu

(10) Patent No.: US 6,262,893 B1
(45) Date of Patent: Jul. 17, 2001

(54) HEAT SINK WITH INTEGRAL COMPONENT CLIP

(76) Inventor: Kechuan Liu, 605 Snead Dr., Plano, TX (US) 75025

( * ) Notice: Subject to any disclaimer, the term of this patent is extended or adjusted under 35 U.S.C. 154(b) by 0 days.

(21) Appl. No.: 09/449,048

(22) Filed: Nov. 24, 1999

(51) Int. Cl.[7] ...................................................... H05K 7/20
(52) U.S. Cl. ......................... 361/704; 361/707; 361/710; 257/707; 165/80.3; 24/295
(58) Field of Search .................... 361/700–706, 361/707, 710, 711–719; 257/706–727, 685, 678, 696, 792; 165/80.2, 80.3, 80.4, 185; 24/295, 457, 458, 513, 625

(56) References Cited

U.S. PATENT DOCUMENTS

| | | | |
|---|---|---|---|
| 2,772,382 | * 11/1956 | Escoffery | 317/234 |
| 4,203,488 | * 5/1980 | Johnson et al. | 165/80 B |
| 4,552,206 | * 11/1985 | Johnson et al. | 165/80.3 |
| 4,709,302 | * 11/1987 | Jordan et al. | 361/388 |
| 5,138,524 | * 8/1992 | Smithers | 361/386 |
| 5,170,012 | * 12/1992 | Braconier | 174/52.3 |
| 5,175,668 | * 12/1992 | Kendel | 361/386 |
| 5,381,041 | * 1/1995 | Harmon | 257/718 |
| 5,587,608 | * 12/1996 | Meng | 257/712 |
| 5,611,393 | * 3/1997 | Vasconcelos et al. | 165/80.3 |
| 5,930,116 | * 7/1999 | Palmer | 361/704 |

* cited by examiner

Primary Examiner—Leo P. Picard
Assistant Examiner—Michael Datskovsky
(74) Attorney, Agent, or Firm—Donald D. Mondul

(57) ABSTRACT

An improved heat sink apparatus for use with an electronic component comprises a base portion and a securing portion. The base portion and the securing portion are of unitary construction. The securing portion is configured to flex about an axis to effect an engaged relation with the base portion at a locus distal from the axis. The base portion and the securing portion cooperate in the engaged relation to substantially fixedly maintain the electronic component in abutting relation with the base portion.

13 Claims, 5 Drawing Sheets

HEAT SINK WITH INTEGRAL COMPONENT CLIP

BACKGROUND OF THE INVENTION

The present invention is directed to heat sink assemblies. In particular, the present invention is directed to heat sink assemblies configured to provide attachment thereto of electronic components without requiring additional parts. Heretofore, attachment of electronic components with heat sinks has been accomplished in several ways. For example, a J-clip structure has been employed wherein a J-shaped clip is oriented to clampingly engage the electronic component against the heat sink using a tapped screw or a bolt-and-nut fastener to apply clamping force to effect the engagement. Supplying clamping force to engage an electrical component with a heat sink base has also been known to be effected using adhesives or spring clips.

Additional operations and associated extra assembly time required for such prior art engagement arrangements contribute to the cost of producing products employing such structures. Moreover, the additional pieces involved in some attachment arrangements provide opportunities for product failure by such events as parts working loose, and dropped or worked-loose parts falling within products. Such loose parts failures may occur either during assembly or during use to cause short-circuit failure by the product. Other clamping structures, such as those using self-tapping screws, may also be problematic; metal particles created by the tapping operation may cause short circuit failure of a product.

Cost of materials is another negative aspect of previous heat sink mounting arrangements. Additional parts, such as screws, washers, bolts, nuts and clips are additional material costs of products employing such heat sink constructions.

There is a need for a heat sink apparatus that facilitates cost-effective assembly of power components for products using cost-effective materials, fewer assembly steps, and less opportunity for misplaced attachment parts to cause short circuit failure of the product.

SUMMARY OF THE INVENTION

An improved heat sink apparatus for use with an electronic component comprises a base portion and a securing portion. The base portion and the securing portion are of unitary construction. The securing portion is configured to flex about an axis to effect an engaged relation with the base portion at a locus distal from the axis. The base portion and the securing portion cooperate in the engaged relation to substantially fixedly maintain the electronic component in abutting relation with the base portion.

The preferred embodiment of the present invention contemplates a one-time assembly operation. As a consequence of such an intended employment, certain advantageous cost-effective material choices may be made.

The unitary construction for a heat sink apparatus according to the present invention avoids the necessity for additional assembly parts such as screws, nuts, bolts, washers, clips and adhesives. The heat sink apparatus of the present invention also avoids the requirement for such expensive materials as spring steel suitable for repeated flexing action to accommodate repeated installations. In such one-time installation, sufficient clamping force may be applied and maintained by cold rolled steel. Cold rolled steel is significantly less expensive than the spring steel that has been used for clip structures designed to accommodate repeated installations in prior heat sink clamping arrangements.

It is, therefore, an object of the present invention to provide an improved heat sink apparatus that is of unitary construction using cost-effective materials.

It is a further object of the present invention to provide an improved heat sink apparatus that may be assembled with an associated electronic component without requiring additional hardware that may be misplaced and cause short circuit failure of a product.

It is yet a further object of the present invention to provide an improved heat sink apparatus that may be assembled with an associated electronic component without unnecessary assembly steps, such as ancillary process operations like drilling or tapping apertures.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
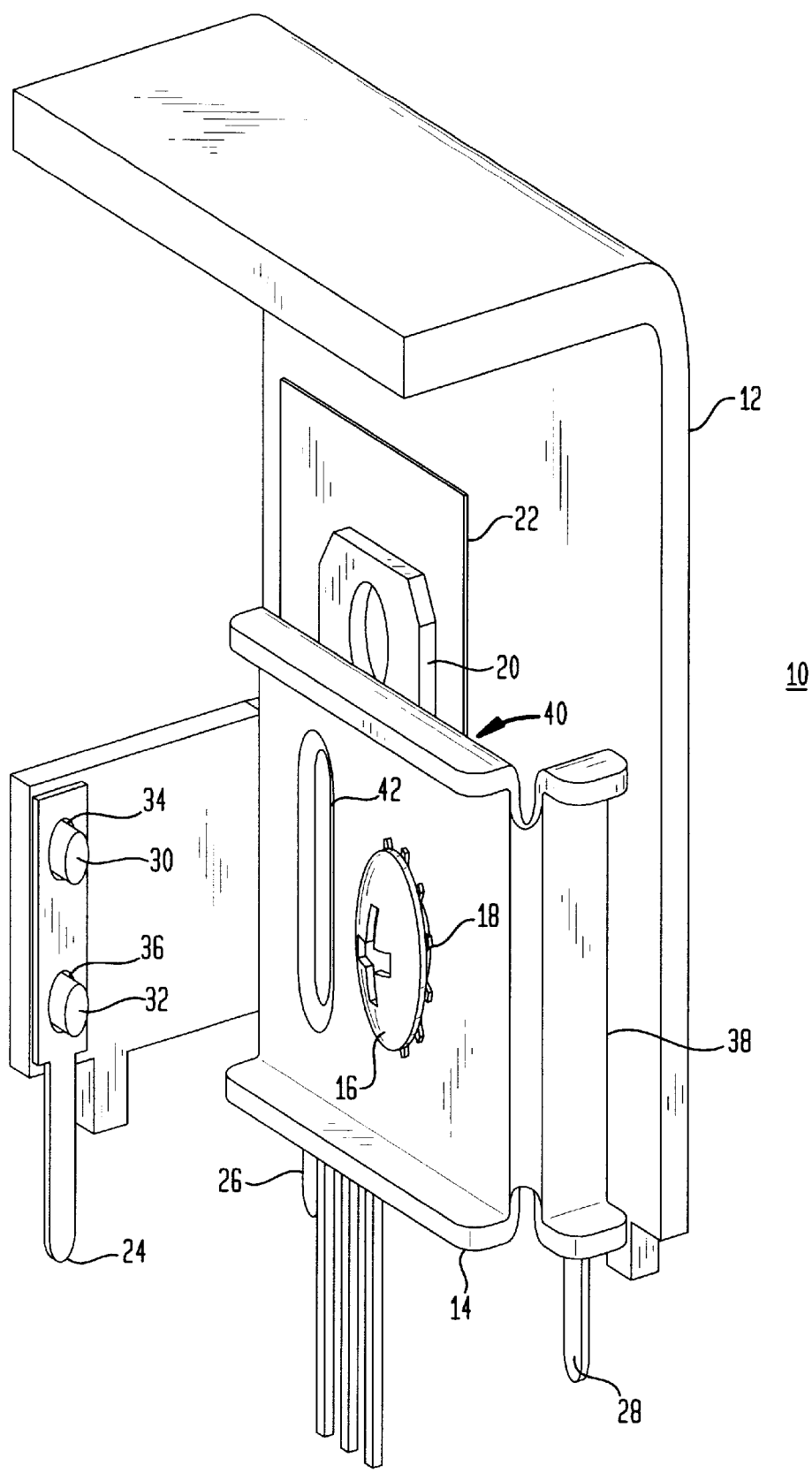
FIG. 1 is a perspective drawing illustrating an example of a prior art construction of a heat sink assembled with an electronic component.

FIG. 1 is a perspective drawing illustrating an example of a prior art construction of a heat sink assembled with an electronic component. In FIG. 1, a heat sink-component assembly 10 includes a heat sink base member 12, a J-clamp 14, a threaded fastener 16, a lock washer 18, and an electronic component 20. Threaded fastener 16 and lock washer 18 may be an assembled unit. A pad 22 may be inserted intermediate electronic component 20 and heat sink base member 12. In some product applications it is desirable to enhance thermal conductivity between electronic component 20 and heat sink base member 12. In such products, pad 22 is preferably a "Grafoil" pad that is configured to reduce contact thermal resistance caused by surface roughness, yet is electronically conductive, to facilitate heat transfer between electronic component 20 and heat sink base member 12. In other product applications it may be desirable to electrically isolate electronic component 20 from heat sink base member 12. In such other products, pad 22 may be an electrically insulating pad situated intermediate electronic component 20 and heat sink base member 12. Electrically insulating pad 22 is preferably also thermally conductive to facilitate heat transfer between electronic component 20 and heat sink base member 12. Either embodiment of pad 22 may be adhesively attached to electronic component 20, or to heat sink base member 12 or to both. Alternatively, threaded fastener 16 may clampingly engage pad 22 between electronic component 20 and heat sink base member 12.

Heat sink base member 12 is preferably constructed of aluminum to provide good heat transfer characteristics at a moderate price. Heat sink base member also includes a plurality of contact members 24, 26, 28 configured for insertion into apertures in a printed wiring board for attachment within a product, as by soldering or adhesive, for example. To facilitate soldering attachment, contact members 24, 26, 28 are preferably constructed of solderable material, such as brass or steel with tin-plating. Accordingly, contact members 24, 26, 28 are attached with heat sink base member 12; such attachment may be effected by any convenient reliable attachment means, such as riveting, staking, pressing, adhesive or the like. In heat sink-component assembly 10, attachment is effected by swaging buttons inserted within apertures on contact members 24, 26, 28. Such attachment is illustrated in FIG. 1 where buttons 30, 32 are inserted within apertures 34, 36 in contact member 24, and swaged to effect unitary connection between contact member 24 and heat sink base member 12.

J-clamp 14 rests an edge 38 in abutting relation against heat sink base member 12, and rests a face 40 in abutting relation against electronic component 20. Electronic component 20 is configured in a manner familiar to those skilled in the art with a heat transferring metal face situated against pad 22 for effecting heat transfer to heat sink base member 12. Threaded fastener 16 may be a self-tapping screw threadedly engaged in an aperture (not shown in FIG. 1) in heat sink base member 12. Alternatively, threaded fastener 16 may be a bolt-and-nut fastener assembly that traverses an aperture (not shown in FIG. 1) in heat sink base member 12 to compressingly engage heat sink base member 12, electronic component 20 and J-clamp 14. Lock washer 18 is intended to preclude loosening of the compression fit among heat sink base member 12, electronic component 20 and J-clamp 14. J-clamp 14 may include a protrusion 42 from face 40 to enhance rigidity of J-clamp 14 and to enhance the clamping compression relation among J-clamp 14, electronic component 20 and heat sink base member 12.

As mentioned earlier, pad 22 may be adhesively attached with heat sink base member 12 before assembly with electronic component 20. Alternatively, pad 22 may be clampingly engaged between electronic component 20 and heat sink base member 12 by a clamping force applied by threaded fastener 16. Thus, in prior art heat sink-component assembly 12 illustrated in FIG. 1, J-clamp 14, threaded fastener 16 (and perhaps an associated nut, not shown in FIG. 1), and lock washer 18 are several loose parts involved in assembling heat sink-component assembly 12.

Figure 2:
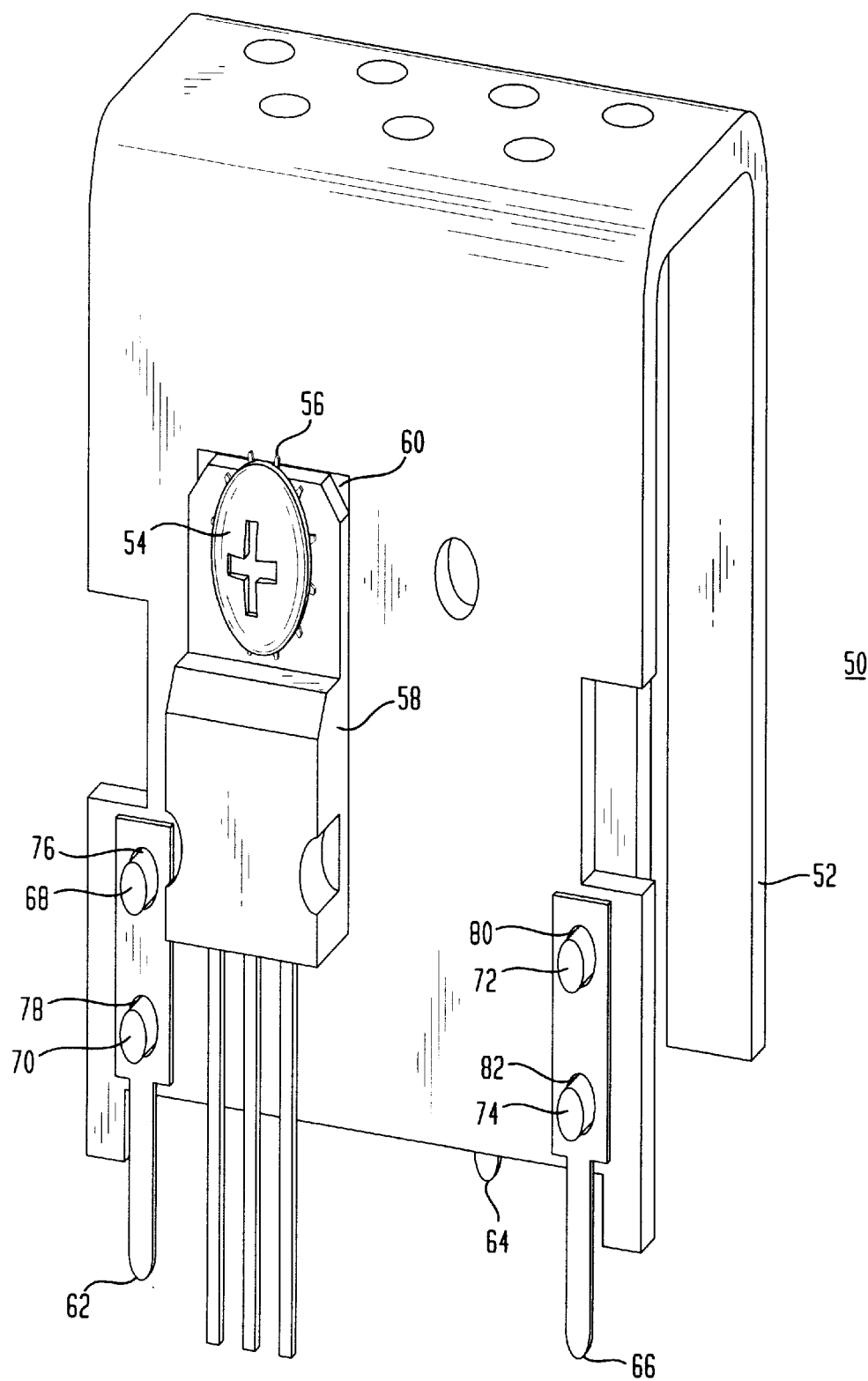
FIG. 2 is a perspective drawing illustrating another example of a prior art construction of a heat sink assembled with an electronic component.

FIG. 2 is a perspective drawing illustrating another example of a prior art construction of a heat sink assembled with an electronic component. In FIG. 2, a heat sink-component assembly 50 includes a heat sink base member 52, a threaded fastener 54, a lock washer 56, an electronic component 58 and (if required) a pad 60. Threaded fastener 54 and lock washer 56 may be an assembled unit. Pad 60 is intended to serve essentially similar purposes in the arrangement illustrated in FIG. 2, and may be installed in similar manners as pad 22 in the arrangement illustrated in FIG. 1. In arrangements involving traversal through pad 60 by threaded fastener 54, such the prior art arrangement illustrated in FIG. 2, an aperture may conveniently be provided in pad 60 (not visible in FIG. 2) to facilitate installation of threaded fastener 54. In the interest of avoiding prolixity, pad 60 will not be further discussed here.

Heat sink base member 52 is preferably constructed of aluminum to provide good heat transfer characteristics at a moderate price. Heat sink base member also includes a plurality of contact members 62, 64, 66 configured for insertion into apertures in a printed wiring board for attachment within a product, as by soldering or adhesive, for example. To facilitate soldering attachment, contact members 62, 64, 66 are preferably constructed of solderable material, such as brass or steel with tin-plating. Contact members 62, 64, 66 are attached with heat sink base member 52; such attachment may be effected by any convenient reliable attachment means, such as riveting, staking, pressing, adhesive or the like. In heat sink-component assembly 50, attachment is effected by swaging buttons inserted within apertures on contact members 62, 64, 66. Such attachment is illustrated in FIG. 2 where buttons 68, 70, 72, 74 are inserted within apertures 76, 78, 80, 82 in contact members 62, 66, and swaged to effect unitary connection between contact members 62, 66 and heat sink base member 52.

Electronic component 58 is configured in a manner familiar to those skilled in the art with a heat transferring metal face situated against pad 60 for effecting heat transfer to heat sink base member 12. Threaded fastener 54 may be a self-tapping screw threadedly engaged in an aperture (not shown in FIG. 2) in heat sink base member 52. Alternatively, threaded fastener 54 may be a bolt-and-nut fastener assembly that traverses an aperture (not shown in FIG. 2) in heat sink base member 52 to compressingly engage heat sink base member 52 and electronic component 58. Lock washer 56 is intended to preclude loosening of the compression fit between heat sink base member 52 and electronic component 58.

As mentioned earlier, pad 60 may be adhesively attached with heat sink base member 52 before assembly with electronic component 58. Alternatively, pad 60 is kept in position by compressive force between electronic component 58 and heat sink base member 52 applied by threaded fastener 54. Thus, in prior art heat sink-component assembly 52 illustrated in FIG. 2, threaded fastener 54 (and perhaps an associated nut, not shown in FIG. 2), and lock washer 56 are loose parts involved in assembling heat sink-component assembly 52.

Figure 3:
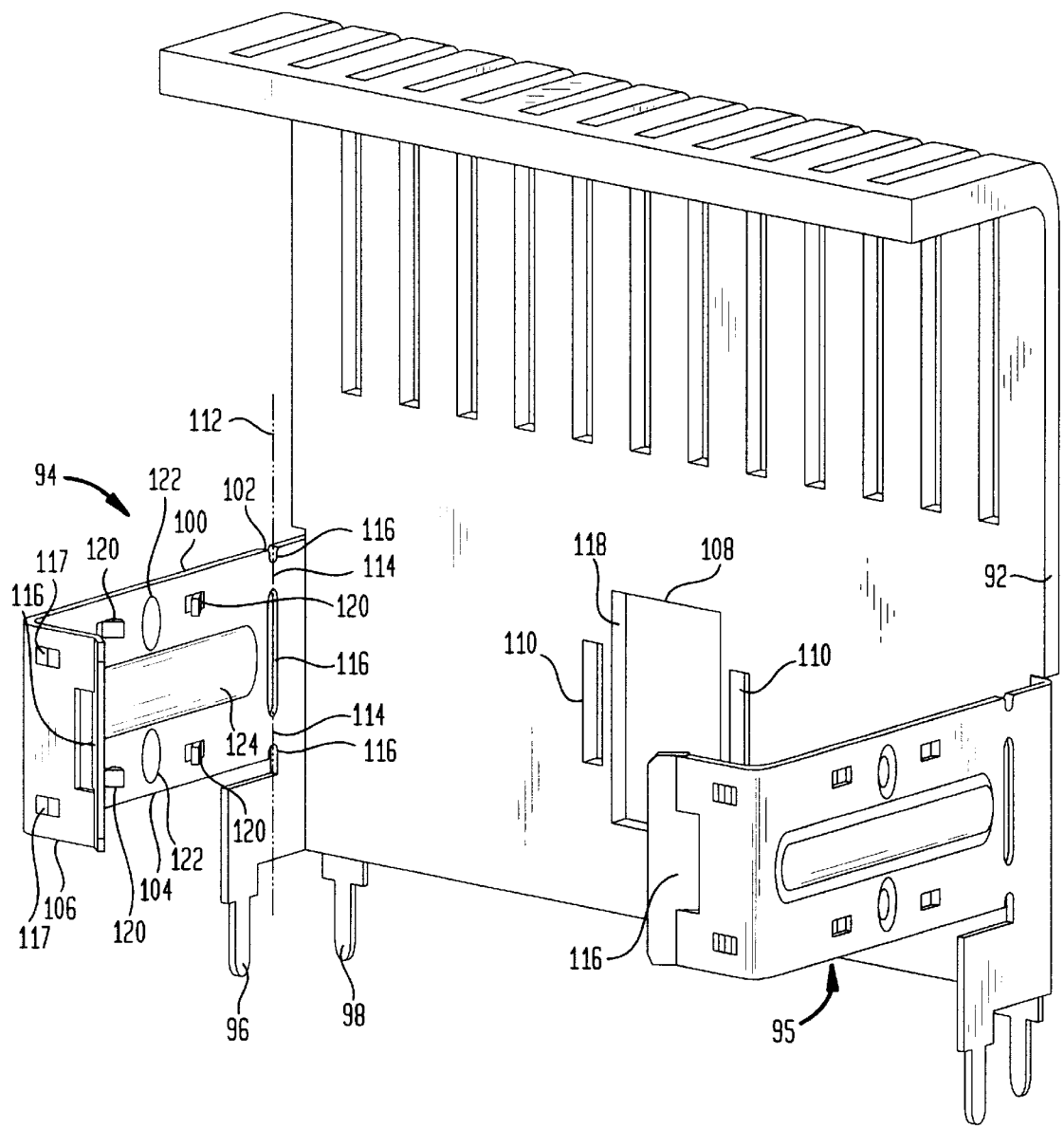
FIG. 3 is a perspective drawing of a front view of an embodiment of the present invention before assembly with an electronic component.

FIG. 3 is a perspective drawing of a front view of an embodiment of the present invention before assembly with electronic components. In FIG. 3, a heat sink apparatus 90 includes a heat sink base member 92, and a pair of clamping assemblies 94, 95. Heat sink base member 92 preferably has a generally multi-planar heat-dissipating shape and is constructed of an inexpensive heat dissipating material, such as aluminum. Each clamping assembly 94, 95 is preferably constructed of a solderable material, such as spring steel or cold rolled steel with tin-plating. In its most preferred embodiment, heat sink apparatus 90 has clamping assemblies 94, 95 constructed of cold rolled steel with tin-plating so that clamping assemblies 94, 95 have spring characteristics sufficient to effect the preferred embodiment of the present invention for one-time assembly operation (as will be presently described in connection with FIG. 4).

In the interest of simplicity, clamping assemblies 94, 95 will be described referring only to clamping assembly 94. In the preferred embodiment of the present invention, clamping assemblies 94, 95 are mirror images of each other. Clamping assembly 94 is attached with heat sink base member 92 by known attachment methods, such as the attachment methods described in connection with contact members associated with base members in FIGS. 1 and 2 above. Of particular importance is the integral structure of clamping assemblies 94 to include contact members 96, 98. Clamping assembly 94 also includes an integrally formed clamping, or securing portion 100. Preferably, clamping portion 100 extends substantially perpendicularly from heat sink base member 92 and includes a web structure 102, a clamping arm 104 and a latch structure 106. Heat sink base member 92 includes a latching aperture 108 and associated adjacent latch catches 110. Latch catches 110 are displaced from latching aperture 108 and are preferably constructed as apertures adjacent to latching aperture 108, yet independent of latching aperture 108.

Web structure 102 is oriented about an axis 112 and is comprised of at least one web 114 and associated voids 116. The resulting web structure 102 has less material in the vicinity of axis 112 than the remainder of clamping portion 100. Such a lesser amount of material oriented substantially along axis 112 provides a flexible sector to clamping portion 100 facilitating flexing of clamping portion 100 substantially about axis 112 to a clamping orientation generally parallel with heat sink base member 92. The resulting clamping orientation effects clamping of an electronic component (not shown in FIG. 3) between clamping arm 104 and heat sink base member 92. When in a clamping orientation, latch structure 106 traverses latching aperture 108. Latch structure 106 includes a latching lip 116. Latching lip 116 is subjected to a bias force as it flexes against proximate edge 118 of latching aperture 108 as latch structure 106 traverses latching aperture 108. Latching lip 116 is released from bias forces as it clears proximate edge 118 and returns to an unbiased position in latching relation with respect to proximate edge 118. Return bias spring force applied by clamping portion 100 from its flexing at web structure 102 about axis 112 urges latching lip 116 against heat sink base member 92 to engage latching lip 116 within latch catch 110. Stop tabs 117 are included in latch structure 106 to limit motion of latch structure 106 through latching aperture 110. In a clamping orientation, stop tabs 117 and latching lip 116 cooperate to limit movement of latch structure 106 in directions substantially perpendicular to heat sink base member 92.

Figure 4:
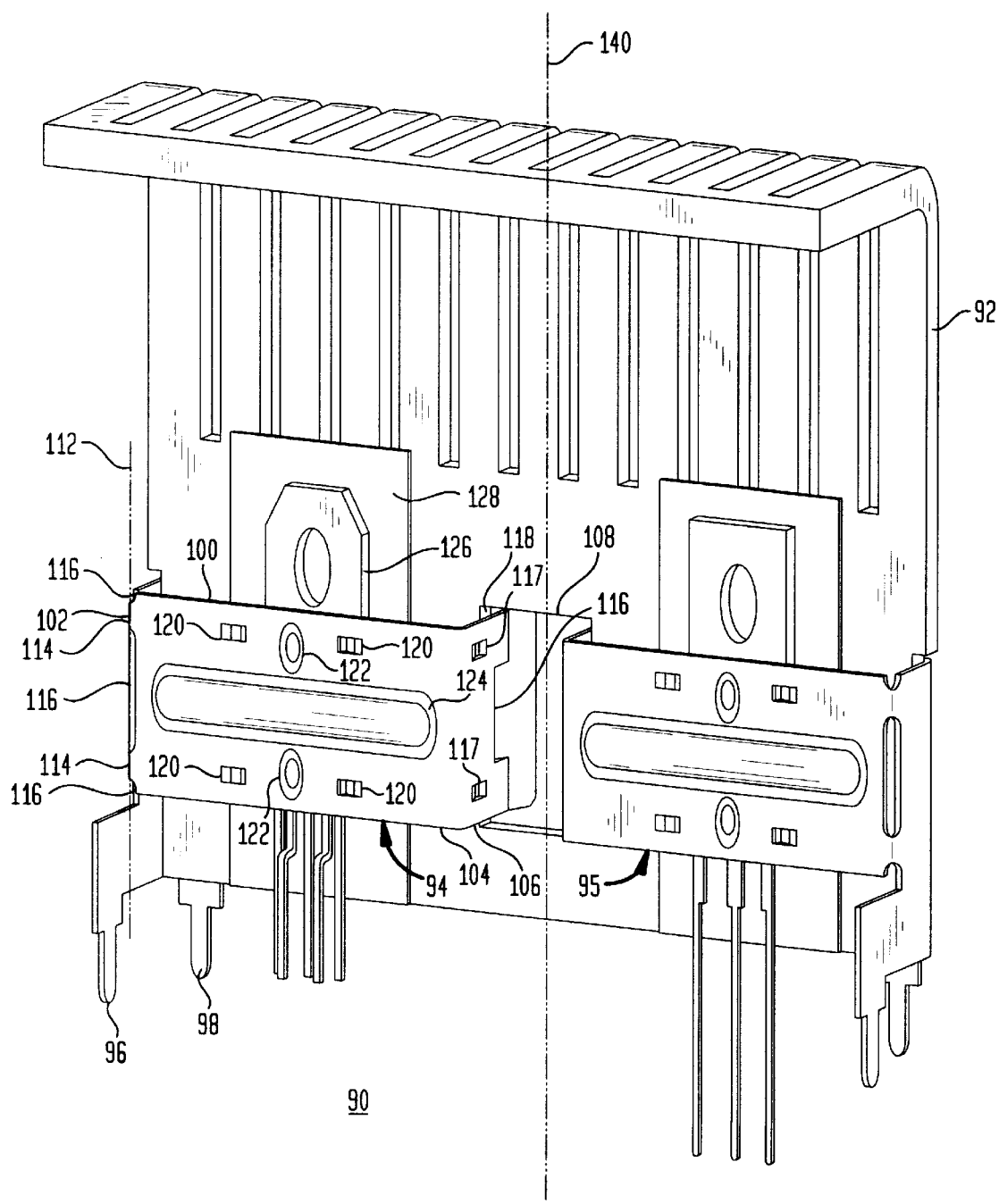
FIG. 4 is a perspective drawing of a front view of the embodiment of the present invention illustrated in FIG. 3 after assembly with electronic components.

Positioning tabs 120 are arrayed on clamping arm 104 in appropriate dimensional distribution to substantially laterally fix an electronic component (not shown in FIG. 3) from movement in directions perpendicular to axis 112 when heat sink apparatus 90 is in a clamping orientation with an electronic component (see FIG. 4). Protrusions 122 extend from clamping arm 104 toward heat sink base member 92 when clamping arm 104 is in a clamping orientation. Protrusions 122 enhance the clamping force applied by clamping arm 104 upon an assembled electronic component between clamping arm 104 and heat sink base member 92. Protrusions 122 also provide a contributing return bias pressure to seat latching lip 116 within latch catch 110. Properly proportioning the distance protrusions 122 extend from clamping arm 104, and the distances between axis 112 and electronic component 126 provides a leverage force applied by clamping arm 104 with protrusions 122 as a fulcrum upon an assembled electronic component to urge latching lip 116 to seat within latch catch 110. A ridge 124 is included in clamping arm 104 to stiffen clamping arm 104. Ridge 124 preferably extends away from heat sink base member 92 when clamping arm 104 is in a clamping orientation substantially parallel with heat sink base member 92. An alternate embodiment, not shown, contemplates establishing ridge 124 to extend toward heat sink base member 92 when clamping arm 104 is in a clamping orientation substantially parallel with heat sink base member 92. Such an alternate construction of clamping arm 104 employs ridge 120 in "double duty" as a stiffener as well as in enhancing clamping action with an assembled electronic component. In such an alternate construction, protrusions 122 could be eliminated.

FIG. 4 is a perspective drawing of a front view of the embodiment of the present invention illustrated in FIG. 3 after assembly with electronic components. In FIG. 4, heat sink apparatus 90 is assembled with an electronic component 126 clampingly engaged between clamping arm 104 and heat sink base member 92. A pad 128 may be installed between electronic component 126 and heat sink base member 92. Pad 128 is optional; it may be employed in connection with heat sink apparatus 90 to enhance heat transfer between electronic component 126 and heat sink base member 92. Pad 128 may be electrically insulating if required by the product employing heat sink apparatus 90. Pad 128 is substantially similar in its configuration, construction, installation and employment as pad 22 (FIG. 1) and pad 60 (FIG. 2). In order to avoid prolixity, pad 128 will not be further discussed here.

In the assembled orientation of heat sink assembly 90 and electronic component 126 illustrated in FIG. 4, clamping portion 100 has been flexed at web structure 102 about axis 112 to orient clamping arm 104 generally parallel with heat sink base member 92. Latch structure 106 has traversed latching aperture 108 and latching lip 116 has reflexed substantially to its position before flexing against proximate edge 118 while traversing latching aperture 108 and engaged in latch catch 110. Preferably, latch catch 110 has a chamfered edge to facilitate catching (not visible in FIG. 4). Stop tabs 117 limit motion of latch structure 106 through latching aperture 110. In a clamping orientation, stop tabs 117 and latching lip 116 cooperate to limit movement of latch structure 106 in directions substantially perpendicular to heat sink base member 92.

Protrusions 122 bear against electronic component 126 to enhance clamping engagement among clamping arm 104, electronic component 126 and heat sink base member 92. Protrusions 122 also contribute a return bias force applied to clamping arm 104 to seat latching lip 116 within latch catch 110 by a levering action using protrusions 122 as fulcrums against electronic component 126. Tabs 120 are located adjacent electronic component 126 to substantially fix electronic component 126 against movement in directions perpendicular to axis 112.

Figure 5:
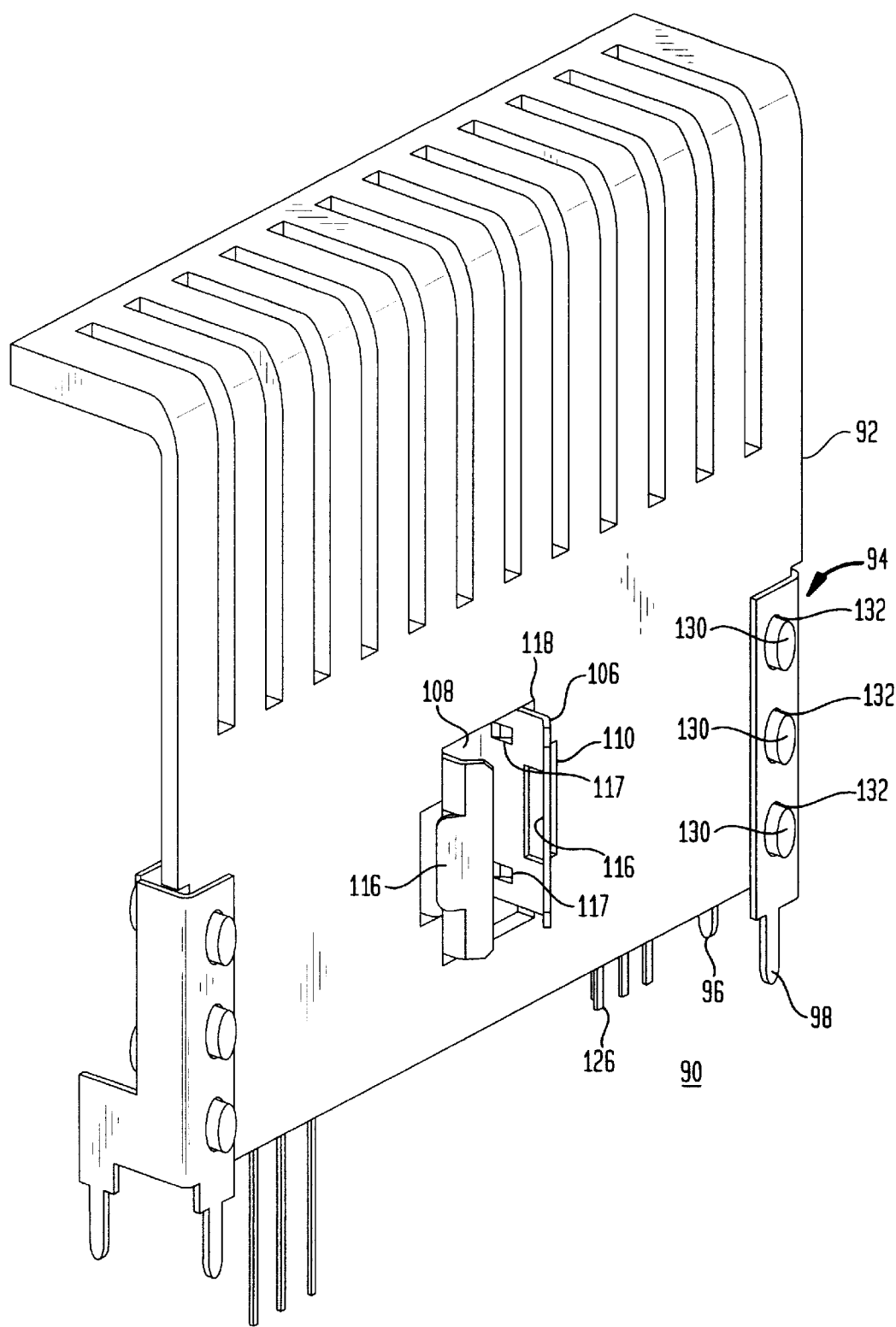
FIG. 5 is a perspective drawing of a rear view of the embodiment of the present invention illustrated in FIG. 3 after assembly with an electronic component.

FIG. 5 is a perspective drawing of a rear view of the embodiment of the present invention illustrated in FIG. 3 after assembly with an electronic component. In FIG. 5, heat sink apparatus 90 is assembled with electronic component 126 clampingly engaged between clamping arm 104 (FIG. 3) and heat sink base member 92. Latch structure 106 has traversed latching aperture 108, and latching lip 116 has reflexed after traversing proximate edge 118 to latchingly engage latch catch 110. Stop tabs 117 bear against heat sink base member 92 to cooperate with latching lip 116 to limit movement of latch structure 106 in directions perpendicular to heat sink base member 92.

Also visible in FIG. 5 is the preferred structure for attaching clamping assembly 94 with heat sink base member 92. Buttons 130, preferably integrally formed of heat sink base member 92, are situated within apertures 132 and swaged or otherwise deformed to firmly affix clamping assembly 94 and heat sink base member 92 into a unitary assembly.

FIGS. 3 through 5 illustrate the preferred embodiment of the present invention configured for compressive latching assembly of heat sink base member 92 with a plurality of electronic components 126. Other embodiments of the present invention are useful as well: a single-unit assembly for engaging a single electronic component is illustrated in FIG. 4 by dividing heat sink assembly 90 in two assemblies along a dividing axis 140. Such a single-component construction is within the scope of the present invention. It is also within the scope of the present invention for clamping arm 104 to span more than one electronic component 126 in a clamping orientation. In such a multi-component spanning design, protrusions 122 (or, in the alternative, ridge 124 reversed) would be carefully designed in their protruding distance in order to ensure proper clamping action for each respective electronic component 126 spanned, as well as to ensure proper leveraging action to contribute return bias force to clamping arm 104. It may be required that respective protrusions 122 associated with different electronic components 126 must extend differing distances in such multi-component spanning arrangements to properly contribute appropriate clamping forces and return bias forces.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An improved heat sink apparatus for use with at least one electronic component; the apparatus comprising:

(a) a base portion; and (b) a securing portion;

said base portion and said securing portion being of unitary construction; said securing portion being configured to rotate about at least one axis to effect an engaged relation with said base portion at a locus distal from said at least one axis; said base portion and said securing portion cooperating in said engaged relation to substantially fixedly maintain said at least one electronic component in abutting relation with said base portion; said securing portion including at least one flexible web connection with said base portion substantially collocated with said at least one axis.

2. An improved heat sink apparatus for use with at least one electronic component; the apparatus comprising:

(c) a base portion; and (d) a securing portion;

said base portion and said securing portion being of unitary construction; said securing portion being configured to rotate about at least one axis to effect an engaged relation with said base portion at a locus distal from said at least one axis; said base portion and said securing portion cooperating in said engaged relation to substantially fixedly maintain said at least one electronic component in abutting relation with said base portion; said engaging motion being effected with at least one aperture and at least one catch shared by said securing portion and said base portion.

3. An improved heat sink apparatus for use with at least one electronic component; the apparatus comprising:

(e) a base portion; and (f) a securing portion;

said base portion and said securing portion being of unitary construction; said securing portion being configured to rotate about at least one axis to effect an engaged relation with said base portion at a locus distal from said at least one axis; said base portion and said securing portion cooperating in said engaged relation to substantially fixedly maintain said at least one electronic component in abutting relation with said base portion; said securing portion including positioning guides to substantially precisely adjoin said at least one electronic component with said base portion.

4. An improved heat sink apparatus for use with at least one electronic component; the apparatus comprising:

(g) a base portion; and (h) a securing portion;

said base portion and said securing portion being of unitary construction; said securing portion being configured to rotate about at least one axis to effect an engaged relation with said base portion at a locus distal from said at least one axis; said base portion and said securing portion cooperating in said engaged relation to substantially fixedly maintain said at least one electronic component in abutting relation with said base portion; said engaged relation being a clamped arrangement with said at least one electronic component clampingly captured by said base portion and said securing portion; said securing portion including at least one projection abutting said at least one electronic device in said engaged relation; said at least one projection being oriented with respect to said at least one electronic component to enhance said clamped arrangement.

5. An improved heat sink apparatus for use with an electronic component; the apparatus comprising:

(a) a heat-dissipating base; and (b) a clamp;

said clamp and said base being integrally attached at a first locus; said clamp extending from said first locus in a first expanse to a web structure a first distance from said first locus; said clamp extending from said web structure in a second expanse to a second locus a second distance from said web structure; said clamp having a latch structure at said second locus; said base having a latch-receiving arrangement; said clamp being flexible at said web structure to effect a clamping attitude with said second expanse generally parallel with said base displaced from said base a clamping distance, and with said latch structure and said latch-receiving arrangement latchingly engaged; said clamping distance being appropriate to establish clamping engagement of said electronic component intermediate said clamp and said base in said clamping attitude.

6. An improved heat sink apparatus for use with an electronic component as recited in claim 5 wherein said clamp includes positioning guides to substantially precisely adjoin said electronic component with said base in said clamping attitude.

7. An improved heat sink apparatus for use with an electronic component as recited in claim 6 wherein said clamp includes at least one projection abutting said electronic device in said clamping attitude; said at least one projection being situated with respect to said electronic component to enhance said clamping engagement.

8. An improved heat sink apparatus for use with at least one electronic component; the apparatus comprising:

(a) a heat-dissipating base; and (b) at least one clamp;

said at least one clamp and said base being integrally attached at at least one first locus; said at least one clamp extending from said at least one first locus in a first expanse to a web structure a first distance from said at least one first locus; said at least one clamp extending from said web structure in a second expanse to a second locus a second distance from said web structure; said at least one clamp having a latch structure at said second locus; said base having at least one latch-receiving arrangement; said at least one clamp being flexible at said web structure to effect a clamping attitude with said second expanse generally parallel with said base displaced from said base a clamping distance, and with said latch structure and said at least one latch-receiving arrangement latchingly engaged; said clamping distance being appropriate to establish clamping engagement of said at least one electronic component intermediate said at least one clamp and said base in said clamping attitude.

9. An improved heat sink apparatus for use with at least one electronic component as recited in claim 8 wherein said at least one clamp includes positioning guides to substantially precisely adjoin said electronic component with said base in said clamping attitude.

10. An improved heat sink apparatus for use with at least one electronic component as recited in claim 9 wherein said at least one clamp includes at least one projection abutting said electronic device in said clamping attitude; said at least one projection being situated with respect to said electronic component to enhance said clamping engagement.

11. An improved heat sink apparatus for use with at least one electronic component as recited in claim 8 wherein said at least one clamp is one clamp, and wherein said at least one electronic component is a plurality of electronic components; said second distance spanning said plurality of electronic components in said clamping attitude.

12. An improved heat sink apparatus for use with at least one electronic component as recited in claim 11 wherein said clamp includes positioning guides to substantially precisely adjoin said plurality of electronic components with said base in said clamping attitude.

13. An improved heat sink apparatus for use with at lease one electronic component as recited in claim 12 wherein said clamp includes at least one projection abutting said plurality of electronic devices in said clamping attitude; said at least one projection being situated with respect to said plurality of electronic components to enhance said clamping engagement.

* * * * *